United States Patent
Cical et al.

(10) Patent No.: US 9,000,800 B1
(45) Date of Patent: Apr. 7, 2015

(54) SYSTEM AND METHOD OF ELIMINATING ON-BOARD CALIBRATION RESISTOR FOR ON-DIE TERMINATION

(71) Applicant: Xilinx, Inc., San Jose, CA (US)

(72) Inventors: Ionut C. Cical, Dublin (IE); Edward Cullen, Clane (IE); Ivan Bogue, Glanmire (IE)

(73) Assignee: Xilinx, Inc., San Jose, CA (US)

( * ) Notice: Subject to any disclaimer, the term of this patent is extended or adjusted under 35 U.S.C. 154(b) by 260 days.

(21) Appl. No.: 13/621,655

(22) Filed: Sep. 17, 2012

(51) Int. Cl.
 *H03K 17/16* (2006.01)
 *H03K 19/00* (2006.01)
 *H03K 19/003* (2006.01)
 *H04L 25/02* (2006.01)

(52) U.S. Cl.
 CPC ...... *H03K 19/0005* (2013.01); *H03K 19/00384* (2013.01); *H04L 25/0278* (2013.01)

(58) Field of Classification Search
 None
 See application file for complete search history.

(56) References Cited

U.S. PATENT DOCUMENTS

| | | | |
|---|---|---|---|
| 5,877,632 A | 3/1999 | Goetting et al. | |
| 5,958,026 A | 9/1999 | Goetting et al. | |
| 6,445,245 B1 | 9/2002 | Schultz et al. | |
| 7,518,394 B1 | 4/2009 | Chirania et al. | |
| 7,859,918 B1 | 12/2010 | Nguyen et al. | |
| 7,902,863 B1 | 3/2011 | Tetzlaff et al. | |
| 8,065,570 B1 | 11/2011 | Simmons et al. | |
| 2009/0259425 A1* | 10/2009 | Ku et al. | 702/104 |

OTHER PUBLICATIONS

U.S. Appl. No. 12/910,288, filed Oct. 22, 2010, Abugharbieh et al.
U.S. Appl. No. 13/219,405, filed Aug. 26, 2011, Marlett et al.
U.S. Appl. No. 13/350,501, filed Jan. 13, 2012, Upadhyaya.

* cited by examiner

*Primary Examiner* — Jany Richardson
(74) *Attorney, Agent, or Firm* — Gerald Chan

(57) ABSTRACT

A system for calibrating impedance of an input/output (I/O) buffer on a semiconductor die includes: the I/O buffer; a temperature sensor on the semiconductor die; and a supply sensor on the semiconductor die. The temperature sensor is configured to acquire temperature information for calibrating the I/O buffer. The supply sensor is configured to acquire voltage information for calibrating the I/O buffer. The I/O buffer comprises: a memory component coupled to the temperature and supply sensors and configured to store the acquired temperature or voltage information; a logic component coupled to the memory component; and a driver with driver legs. The driver is coupled to the logic component. The logic component is configured to generate driver control signals representing an on/off configuration for the driver legs of the driver based at least in part on the acquired temperature information or the acquired voltage information stored in the memory component.

19 Claims, 5 Drawing Sheets

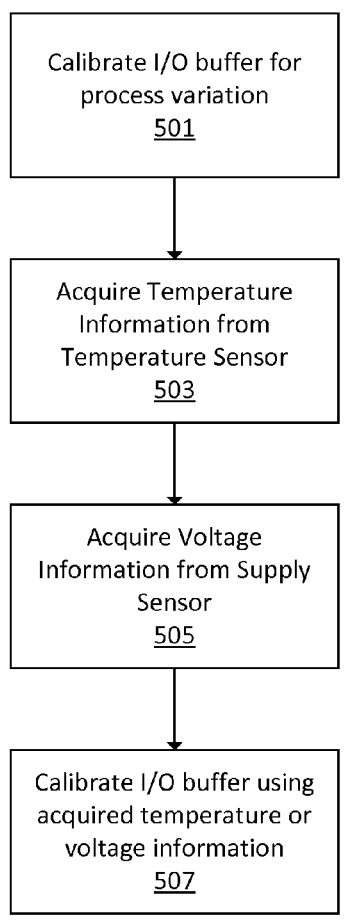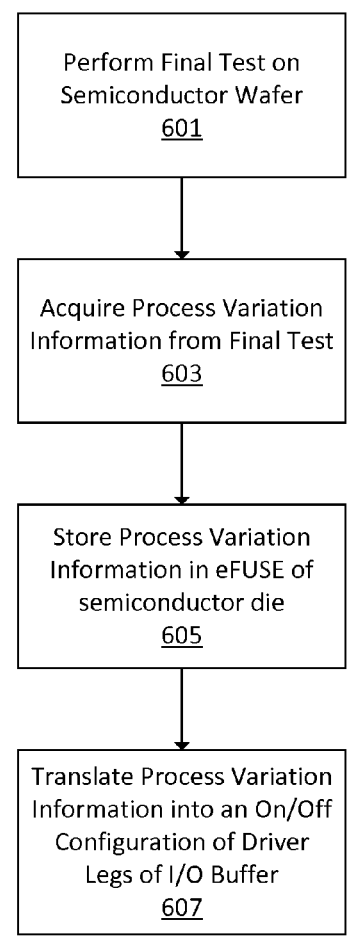
FIG. 5
FIG. 6

US 9,000,800 B1

SYSTEM AND METHOD OF ELIMINATING ON-BOARD CALIBRATION RESISTOR FOR ON-DIE TERMINATION

TECHNICAL FIELD

An embodiment described herein relates generally to calibrating on-die termination for input/output (I/O) buffers of a semiconductor die, and in particular to calibrating on-die termination for process, temperature, and voltage variation without using an on-board calibration resistor.

BACKGROUND

For input/output (I/O) interfaces that exist between field programmable gate arrays (FPGAs) and dynamic random access memory (DRAM), I/O buffers driving signals from the FPGA to the DRAM (and vice versa) must be calibrated to compensate for any impedance discontinuity that may exist between the I/O buffer and board traces coupled between the FPGA and DRAM. Calibration of the I/O buffers is performed to reduce the noise being reflected back into the I/O buffer when during signal transmission.

Impedance discontinuity that exists between the I/O buffers and board traces may be due to process variation, temperature variation, and voltage variation. Currently, calibration of I/O buffers is done by connecting a precision resistor on-board (e.g., external to semiconductor die) and dedicating an I/O buffer of an I/O bank for performing calibration. The precision resistor is used to determine the amount of impedance discontinuity associated with the dedicated I/O buffer and the remaining I/O buffers of the I/O bank are calibrated accordingly. Using an on-board precision resistor increases implementation costs. Furthermore, dedicating an I/O buffer for calibration limits its ability to be used for another function.

SUMMARY

In accordance with some embodiments, a system for calibrating impedance of an input/output (I/O) buffer on a semiconductor die includes: the I/O buffer on the semiconductor die, a temperature sensor on the semiconductor die, wherein the temperature sensor is configured to acquire temperature information for calibrating the I/O buffer; and a supply sensor on the semiconductor die, wherein the supply sensor is configured to acquire voltage information for calibrating the I/O buffer. The I/O buffer comprises: a memory component coupled to the temperature sensor and the supply sensor, the memory component configured to store the acquired temperature information or the acquired voltage information; a logic component coupled to the memory component; and a driver with driver legs, wherein the driver is coupled to the logic component; wherein the logic component is configured to generate driver control signals representing an on/off configuration for the driver legs of the driver of the I/O buffer based at least in part on the acquired temperature information or the acquired voltage information stored in the memory component.

In accordance with other embodiments, a method for calibrating impedance of an input/output (I/O) buffer of a semiconductor die includes: calibrating the I/O buffer for process variation; acquiring temperature information from a temperature sensor located on the semiconductor die; acquiring voltage information from a supply sensor located on the semiconductor die; and calibrating the I/O buffer using the acquired temperature information or the voltage information.

Other and further aspects and features will be evident from reading the following detailed description of the embodiments.

BRIEF DESCRIPTION OF THE DRAWINGS

The drawings illustrate the design and utility of embodiments, in which similar elements are referred to by common reference numerals. These drawings are not necessarily drawn to scale. In order to better appreciate how the above-recited and other advantages and objects are obtained, a more particular description of the embodiments is rendered, and illustrated in the accompanying drawings. These drawings depict only exemplary embodiments and are not therefore to be considered limiting in the scope of the claims.

FIG. 5 is a flow diagram illustrating a method for calibrating impedance of an I/O buffer of a semiconductor die.

FIG. 6 is a flow diagram illustrating a method for calibrating impedance of an I/O buffer for process variation.

DETAILED DESCRIPTION

Figure 1:
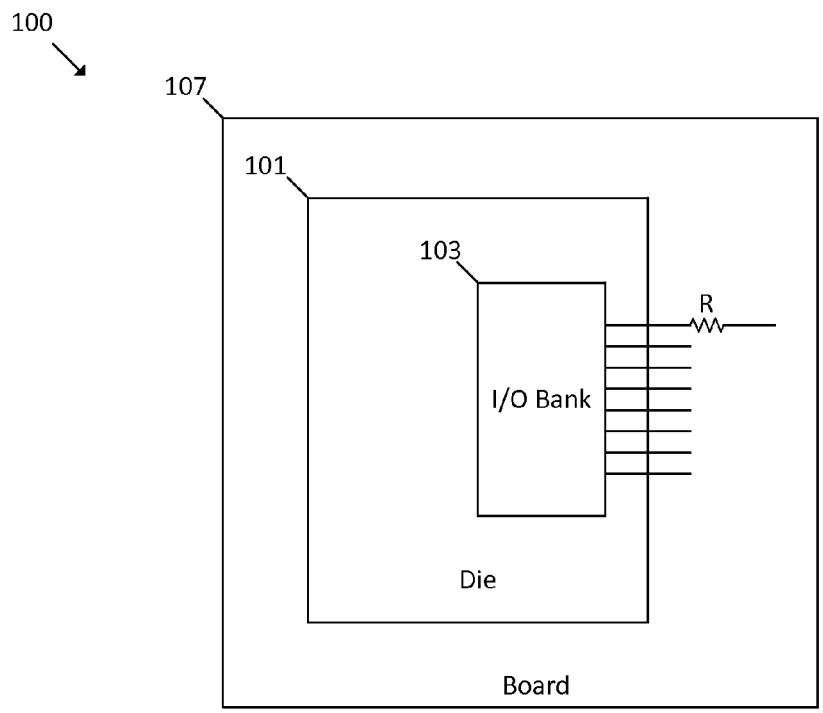
FIG. 1 illustrates a system for calibrating impedance of an I/O buffer of a semiconductor die.

Various embodiments are described hereinafter with reference to the figures. It should be noted that the figures are not necessarily drawn to scale and that the elements of similar structures or functions are represented by like reference numerals throughout the figures. It should be noted that the figures are only intended to facilitate the description of the embodiments. They are not intended as an exhaustive description of the claimed invention or as a limitation on the scope of the claimed invention. In addition, an illustrated embodiment need not have all the aspects or advantages shown. An aspect or an advantage described in conjunction with a particular embodiment is not necessarily limited to that embodiment and can be practiced in any other embodiment even if not so illustrated, or not so explicitly described. Also, reference throughout this specification to "some embodiments" or "other embodiments" means that a particular feature, structure, material, or characteristic described in connection with the embodiments is included in at least one embodiment. Thus, the appearances of the phrase "some embodiments" or "other embodiments" in various places throughout this specification are not necessarily referring to the same embodiment or embodiments.

For input/output (I/O) interfaces that exist between field programmable gate arrays (FPGAs) and dynamic random access memory (DRAM), I/O buffers driving signals from the FPGA to the DRAM (and vice versa) must be calibrated to compensate for any impedance discontinuity that may exist between the I/O buffer and board traces coupled between the FPGA and DRAM. Calibration of the I/O buffers is performed to reduce the energy being reflected back into the I/O buffer when during signal transmission.

Impedance discontinuity that exists between the I/O buffers and board traces may be due to process variation, temperature variation, and voltage variation. Process variation refers to variations in attributes (e.g., lengths, widths, thicknesses, etc.) of components of the semiconductor die due to the fabrication process. Temperature variation refers to variations in attributes of components of the semiconductor die due to fluctuations in temperature (both internal and external) due to the operating environment of the semiconductor die. Voltage variation refers to variations in attributes of components of the semiconductor die due to fluctuations in supply voltage being supplied to the various components caused by the operating environment.

Currently, calibration of impedance for I/O buffers is done by connecting a precision resistor on-board (e.g., external to semiconductor die) and dedicating an I/O buffer of an I/O bank for performing calibration. The precision resistor is used to determine the amount of impedance discontinuity associated with the dedicated I/O buffer and the remaining I/O buffers of the I/O bank are calibrated accordingly. Using an on-board precision resistor increases implementation costs. Furthermore, dedicating an I/O buffer for calibration limits its ability to be used for another function.

FIG. 1 illustrates a conventional system 100 for calibrating impedance of an I/O buffer of a semiconductor die. The system 100 includes a semiconductor die 101 with a bank of I/O buffers 103 used to transmit and receive various signals. The semiconductor die 101 is mounted on a board 107 (e.g., printed circuit board (PCB). A precision resistor R situated on the board 101 is coupled to a dedicated I/O buffer of the I/O bank 103. One I/O buffer of the I/O bank 103 is dedicated for performing calibration and works in conjunction with the precision resistor R to calibrate the impedance of the I/O buffer, which will be discussed in further detail below.

Figure 2:
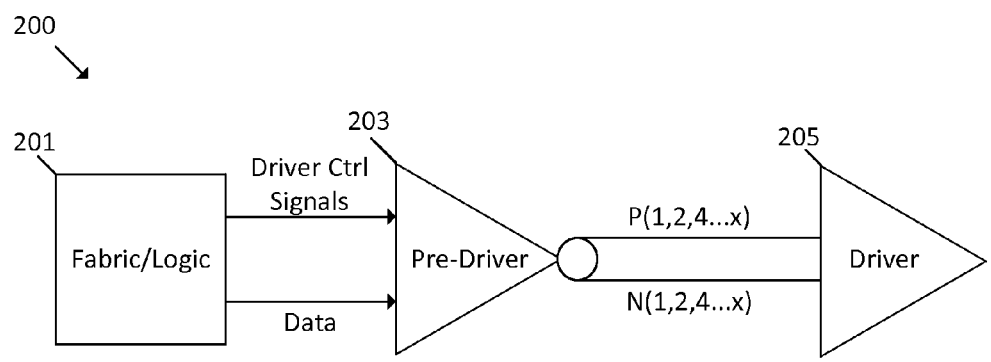
FIG. 2 illustrates an I/O buffer.

FIG. 2 illustrates a more detailed view of an I/O buffer 200. The I/O buffer 200 includes fabric/logic 201, a pre-driver 203, and a driver 205. The fabric/logic 201 of the I/O buffer 200 serves two functions. One function of the fabric/logic 201 is to transmit signals to the driver 205 or to receive signals from the driver 205. In the I/O buffer 200 illustrated in FIG. 2, the driver 205 is an output driver that receives signals transmitted from the fabric/logic. Another function of the fabric/logic 201 is to determine an on/off configuration of the driver 205, which will be described in further detail below. The driver control signals (e.g., signals representing an on/off configuration of the driver) are transmitted from the fabric/logic 201 to the pre-driver 203 which in turn translates the driver control signals into an on/off configuration of the driver 205. The data is transmitted from the fabric/logic 201 to the pre-driver 203 which in turn provides the data to the driver 205.

Figure 3:
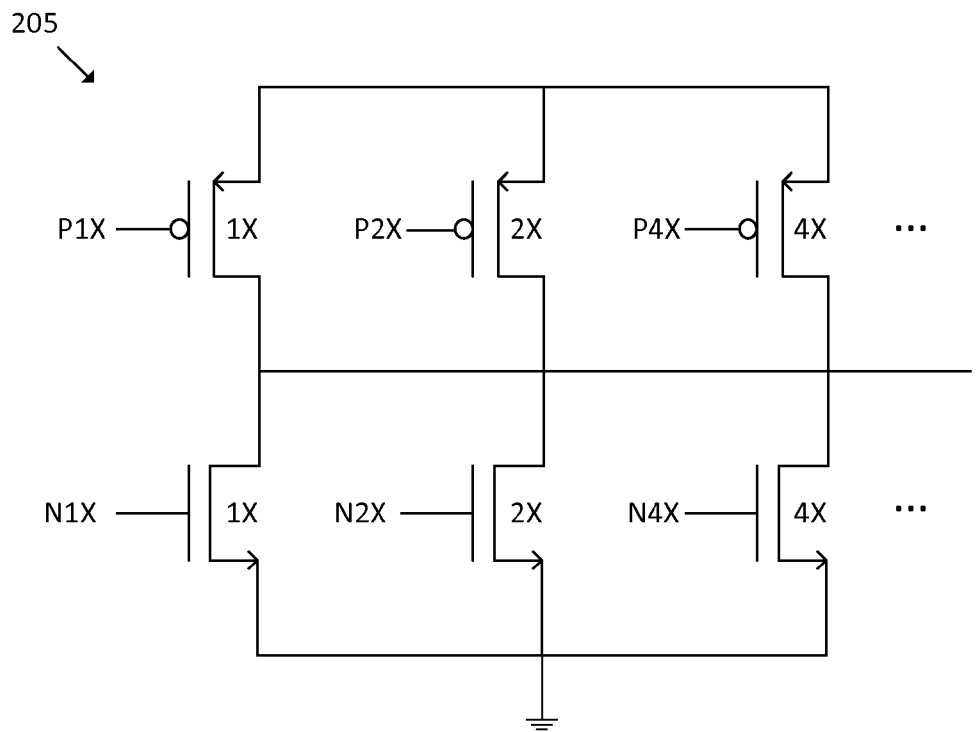
FIG. 3 illustrates a driver of the I/O buffer.

FIG. 3 illustrates a more detailed view of a driver 205. The driver 205 includes a plurality of legs comprising PMOS and NMOS transistors. The impedance of the I/O buffer 200 can be controlled by modifying the on/off configuration of the legs of the driver 205. Thus, the fabric/logic 201 of the I/O buffer 200 determines the on/off configuration of the driver, which are represented in the form of driver control signals, and the pre-driver translates these signals into an on/off of the driver.

Conventionally a comparator (not shown) is coupled to the driver 205 of the I/O buffer 200 as well as to a reference voltage (not shown). The precision resistor R is also coupled to the output of the driver 205, in order to provide a reference for performing calibration. The comparator compares the signal being output from the driver 205 to the reference voltage and forwards this information to the fabric/logic 201 of the I/O buffer 200 for determining an on/off configuration of the driver 205. One ordinarily skilled in the art will recognize that various methods exist for calibrating the impedance of the I/O buffer using a dedicated I/O buffer, a comparator, and an on-board precision resistor.

This calibration process is performed continuously in order to account for changes in temperature and supply variation. The on/off configuration of driver 205 for the dedicated I/O buffer 200 is then forwarded on to other I/O buffers of the I/O bank 103 that require a calibrated impedance.

As discussed above, using an on-board precision resistor R increases implementation costs and dedicating an I/O buffer for calibration limits its ability to be used for another function.

Figure 4:
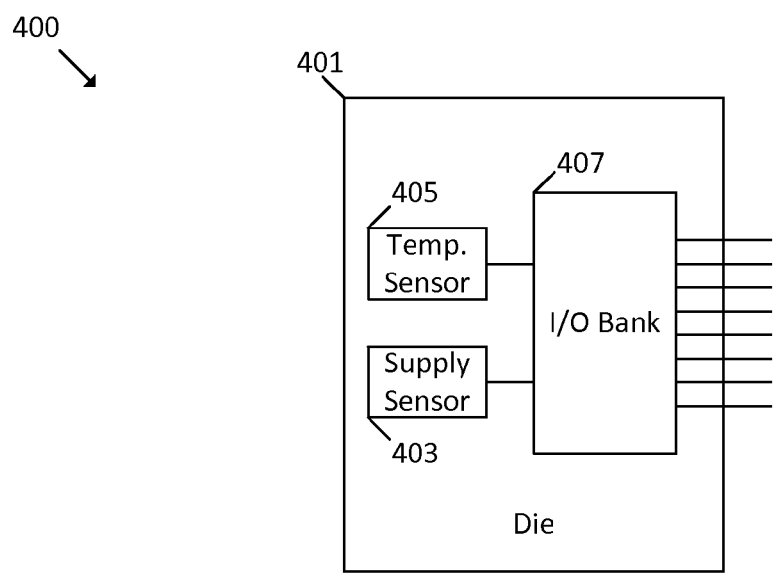
FIG. 4 illustrates a system for calibrating impedance of an I/O buffer of a semiconductor die.

FIG. 4 illustrates a system 400 for calibrating impedance of an I/O buffer of a semiconductor die. The system 400 includes a semiconductor die 401 with a bank of I/O buffers 403 used to transmit and receive various signals. The I/O buffers are coupled to a temperature sensor 405 and a supply sensor 407, which are located on the semiconductor die 401 and used to facilitate calibration of the I/O buffers. The calibration process will be discussed in further detail below. Thus, the system 400 for calibrating an I/O buffer of FIG. 4 eliminates the need for an on-board precision resistor, thereby reducing implementation costs. Furthermore, an I/O buffer of the I/O bank no longer has to be dedicated for calibration, and as such can be used to perform other functions.

FIG. 5 is a flow diagram illustrating a method 500 for calibrating impedance of an I/O buffer of a semiconductor die. Initially, the I/O buffer is calibrated for process variation as described at 501. Because process variation is the result of the fabrication process, any variation and impedance discontinuity associated with process variation is fixed, and thus calibration need only be performed for process variation once. The calibration of the I/O buffer for process variation can be performed during the final test of the semiconductor wafer, as discussed in further detail below.

After the I/O buffer has been calibrated for process variation, the I/O buffer is further calibrated for temperature and voltage variation. Because temperature and voltage variation is a function of operating environment, such calibration may need to be performed continuously to account for fluctuations in the operating environment. Temperature information is acquired from the temperature sensor located on the semiconductor die as described at 503. Such temperature information may be any information related to the temperature of the operating environment that may affect the impedance and performance of the I/O buffers.

Next, voltage information is acquired from the supply sensor located on the semiconductor die as described at 505. Such voltage information may be any information related to the supply voltages in the operating environment that may affect the impedance and performance of the I/O buffers.

The I/O buffer is then calibrated using the acquired temperature or voltage information as described at 507. In some embodiments, the calibration of the I/O buffer (e.g., on/off configuration of driver legs) may be accomplished by comparing the temperature/voltage information acquired by the temperature/supply sensor to indicated limits determined during silicon characterization of the I/O buffer. Such calibration will be described in further detail below.

By utilizing a supply sensor and temperature sensor of the semiconductor die as described in FIG. 5 for calibrating I/O buffers of a semiconductor die, the need for an on-board precision resistor may be eliminated, thereby reducing implementation costs. Furthermore, an I/O buffer of the I/O bank no longer has to be dedicated for calibration, and as such can be used to perform other functions.

FIG. 6 is a flow diagram illustrating a method for calibrating impedance of an I/O buffer for process variation. As discussed above, process variation is the result of the fabrication process. Any variation and impedance discontinuity associated with process variation is fixed, and thus calibration need only be performed for process variation once.

Initially a final test is performed on the semiconductor die after the fabrication process as described at 601. The final test measures various parameters of the semiconductor die to determine any process variation (e.g., length, height, thickness) associated with components of the semiconductor die caused by the fabrication process. Once the final test is performed on the semiconductor die, the process variation information is acquired as described at 603.

Next, the process variation information may optionally be stored in an eFUSE of the semiconductor die as described at 605. An eFUSE is a component of the semiconductor die that is utilized to allow circuits on a chip to change while the circuit is in operation. Alternatively, the process variation information may be stored in a memory cell of the semiconductor die.

The process variation information is then translated into an on/off configuration for driver legs of the I/O buffer as described at 607. The process variation information may be passed onto a logic component of the semiconductor die, which utilizes the information to determine an on/off configuration for driver legs of the I/O buffer that eliminates impedance discontinuity of the I/O buffer.

Figure 7:
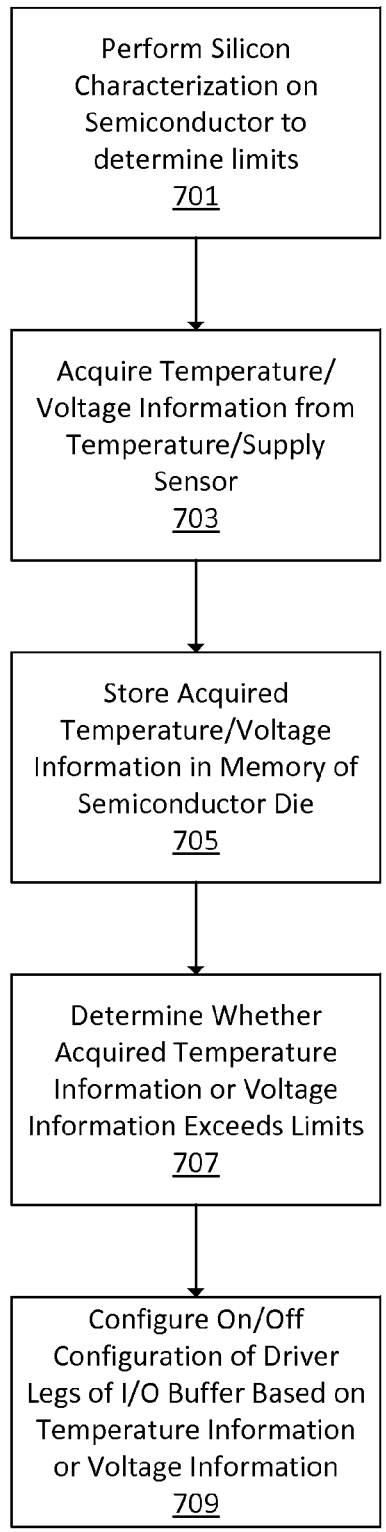
FIG. 7 is a flow diagram illustrating a method for calibrating impedance of an I/O buffer for temperature or voltage variation.

Once the I/O buffer has been calibrated for process variation, impedance discontinuity may still arise due to temperature and voltage variations in the operating environment. FIG. 7 is a flow diagram illustrating a method for calibrating impedance of an I/O buffer for temperature or voltage variation. Initially silicon characterization is performed on the semiconductor die to determine temperature and voltage limits as described at 701. For example, the silicon characterization may determine a relationship between temperature or voltage and I/O buffer impedance. That relationship may be used to set temperature and voltage variation limits that are allowable for maintaining the same I/O buffer impedance. Such information may be stored in a memory of the semiconductor die and later accessed by the fabric/logic of the semiconductor die.

After the silicon characterization has been performed, temperature or voltage information may be acquired from the temperature sensor and supply sensor of the semiconductor die, respectively, as described at 703. Next, the temperature or voltage variation information may optionally be stored in a memory of the semiconductor die as described at 705. Alternatively, the temperature or voltage variation information may be stored in a memory cell of the semiconductor die.

The system may then determine whether the acquired temperature or voltage information exceeds the temperature or voltage limits as described at 707. The fabric/logic of the semiconductor die may compare the acquired temperature or voltage information to the temperature or voltage limits determined during silicon characterization. The result of the comparison may indicate that the acquired temperature or voltage information does not exceed the temperature or voltage limits determined during silicon characterization. In this case, the fabric/logic of the semiconductor die will leave the on/off configuration of the driver legs of the I/O buffer unchanged.

When the result of the comparison indicates that the acquired temperature or voltage information does exceed the temperature or voltage limits determined during silicon characterization, the logic/fabric of the semiconductor die will configure the on/off configuration of the driver legs of the I/O buffer based on the temperature information or voltage information as described at 709. For example, the logic/fabric of the semiconductor die may determine that one or more driver legs of the I/O buffer will need to be turned on to account for the impedance discontinuity introduced by the temperature/voltage variation. Alternatively, the logic/fabric of the semiconductor die may determine that one or more driver legs of the I/O buffer will need to be turned off to account for the impedance discontinuity introduced by the temperature/voltage variation. One ordinarily skilled in the art will recognize that the logic/fabric may determine various on/off configurations for the driver legs of the I/O buffer to account for the impedance discontinuity introduced by temperature/voltage variations.

Figure 8:
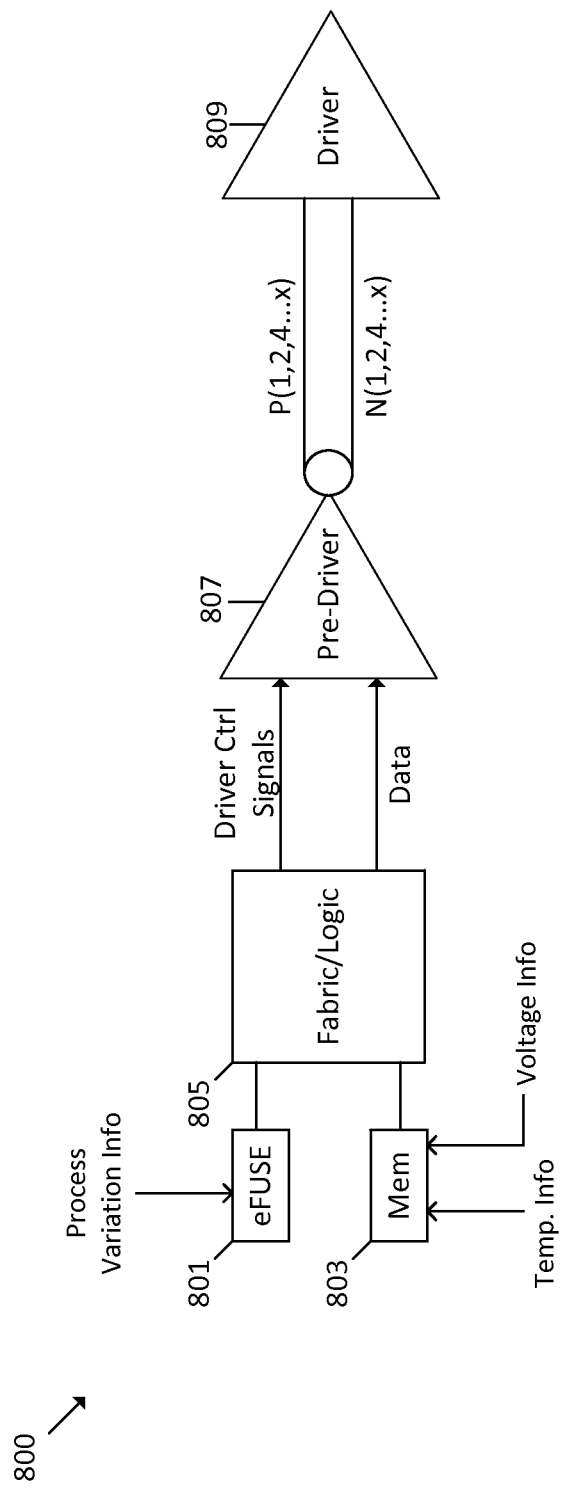
FIG. 8 illustrates an I/O buffer.

FIG. 8 illustrates an I/O buffer 800. I/O buffer 800 includes an eFUSE 801, a memory 803, fabric/logic 805, a pre-driver 807, and a driver 809. An eFUSE 801 is a component of the semiconductor die that is utilized to allow circuits on a chip to change while the circuit is in operation.

In I/O buffer 800 of FIG. 8, the process variation information determined during the final test of the semiconductor die is stored in the eFUSE 801. However, in other embodiments, the process variation information determined during the final test of the semiconductor die may be stored in memory cells 803 of the semiconductor die.

In I/O buffer 800 of FIG. 8, the temperature/voltage variation information acquired by the temperature/supply sensor is stored in the memory cells 803 of the semiconductor die.

The process variation information and temperature/voltage variation information may be determined as described above in FIGS. 6 and 7, for example. This information may be transmitted to the fabric/logic 805 of the semiconductor die, which determines an on/off configuration of the driver legs of the driver 805 in the form of driver control signals. The driver control signals (e.g., on/off configuration of the driver) are transmitted from the fabric/logic 805 to the pre-driver 807 which in turn translates the driver control signals into an on/off configuration of the driver 809. The data is transmitted from the fabric/logic 805 to the pre-driver 807 which in turn provides the data to the driver 809.

By utilizing a supply sensor and temperature sensor of the semiconductor die for calibrating I/O buffers of a semiconductor die, the need for an on-board precision resistor may be eliminated, thereby reducing implementation costs. Furthermore, an I/O buffer of the I/O bank no longer has to be dedicated for calibration, and as such can be used to perform other functions.

Although particular embodiments have been shown and described, it will be understood that they are not intended to limit the claimed invention, and it will be made obvious to those skilled in the art that various changes and modifications may be made without departing from the claimed invention. The specification and drawings are, accordingly, to be regarded in an illustrative rather than restrictive sense. The claimed invention is intended to cover modifications and alternatives.

What is claimed is:

1. A system for calibrating impedance of an input/output (I/O) buffer on a semiconductor die, comprising:
   the I/O buffer on the semiconductor die;
   a temperature sensor on the semiconductor die, wherein the temperature sensor is configured to acquire temperature information for calibrating the I/O buffer;
   a supply sensor on the semiconductor die, wherein the supply sensor is configured to acquire voltage information for calibrating the I/O buffer;
   wherein the I/O buffer comprises:
      a memory component coupled to the temperature sensor and the supply sensor, the memory component configured to store the acquired temperature information or the acquired voltage information;

a logic component coupled to the memory component; and a driver with driver legs, wherein the driver is coupled to the logic component;

wherein the logic component is configured to generate driver control signals representing an on/off configuration for the driver legs of the driver of the I/O buffer based at least in part on the acquired temperature information or the acquired voltage information stored in the memory component.

2. The system of claim 1, wherein:

the memory component is further configured to store process variation information; and the logic component is configured to determine the on/off configuration for the driver legs based at least in part on the process variation information.

3. The system of claim 2, wherein the memory component comprises:

an eFUSE for storing the process variation information; and a memory cell for storing the acquired voltage information or the acquired temperature information.

4. The system of claim 1, wherein the memory component is a memory cell of the semiconductor die.

5. The system of claim 1, further comprising a pre-driver coupled between the logic component and the driver;

wherein the pre-driver is configured to translate the driver control signals generated by the logic component into an on/off configuration for the driver legs.

6. The system of claim 1, wherein the on/off configuration for the driver legs is configured to provide an impedance of the I/O buffer.

7. The system of claim 1, wherein the logic component is configured to provide impedance calibration without using an on-board resistor.

8. The system of claim 1, wherein the logic component is configured to provide impedance calibration without dedicating an I/O buffer for calibration.

9. The system of claim 1, wherein the driver legs are PMOS or NMOS transistors.

10. The system of claim 1, wherein the impedance of the I/O buffer matches an impedance of a transmission line.

11. A method for calibrating impedance of an input/output (I/O) buffer of a semiconductor die, comprising:

calibrating the I/O buffer for process variation;

acquiring temperature information from a temperature sensor located on the semiconductor die;

acquiring voltage information from a supply sensor located on the semiconductor die; and calibrating the I/O buffer using the acquired temperature information or the voltage information;

wherein the act of calibrating the I/O buffer using the acquired temperature information or the voltage information further comprises configuring an on/off configuration for driver legs of the I/O buffer.

12. The method of claim 11, wherein the act of calibrating the I/O buffer for process variation comprises storing process variation information in an eFUSE of the I/O buffer.

13. The method of claim 12, wherein the act of calibrating the I/O buffer for process variation further comprises translating the process variation information in the eFUSE into an on/off configuration for driver legs of the I/O buffer.

14. The method of claim 11, wherein the act of calibrating the I/O buffer using the acquired temperature information or the voltage information comprises determining whether the acquired temperature information or the acquired voltage information exceeds a limit.

15. The method of claim 14, wherein the act of determining whether the acquired temperature information or the acquired voltage information exceeds a limit is performed based on a silicon characterization of the semiconductor die.

16. The method of claim 11, wherein the acquired temperature information or the acquired voltage information is stored within a memory of the I/O buffer.

17. The method of claim 11, wherein the impedance of the I/O buffer of the semiconductor die is calibrated to match an impedance of a transmission line.

18. The method of claim 11, wherein the impedance of the I/O buffer of the semiconductor die is calibrated without an on-board calibration resistor.

19. The method of claim 11, wherein the impedance of the I/O buffer of the semiconductor die is calibrated without dedicating a package pin of the semiconductor die for calibration.

* * * * *